United States Patent
Zhu

(10) Patent No.: US 10,497,809 B2
(45) Date of Patent: Dec. 3, 2019

(54) FINFET, METHOD OF MANUFACTURING THE SAME, AND ELECTRONIC DEVICE INCLUDING THE SAME

(71) Applicant: Institute of Microelectronics, Chinese Academy of Sciences, Beijing (CN)

(72) Inventor: Huilong Zhu, Poughkeepsie, NY (US)

(73) Assignee: Microelectronics, Chinese Academy of Sciences, Beijing (CN)

(*) Notice: Subject to any disclaimer, the term of this patent is extended or adjusted under 35 U.S.C. 154(b) by 0 days.

(21) Appl. No.: 16/083,744

(22) PCT Filed: Jun. 27, 2016

(86) PCT No.: PCT/CN2016/087240
§ 371 (c)(1),
(2) Date: Sep. 10, 2018

(87) PCT Pub. No.: WO2017/156913
PCT Pub. Date: Sep. 21, 2017

(65) Prior Publication Data
US 2019/0252538 A1    Aug. 15, 2019

(30) Foreign Application Priority Data
Mar. 17, 2016 (CN) .......................... 2016 1 0153719

(51) Int. Cl.
*H01L 29/78* (2006.01)
*H01L 29/66* (2006.01)
(Continued)

(52) U.S. Cl.
CPC .......... *H01L 29/785* (2013.01); *H01L 29/517* (2013.01); *H01L 29/6653* (2013.01);
(Continued)

(58) Field of Classification Search
CPC ................. H01L 29/785; H01L 29/517; H01L 29/66795; H01L 29/6653; H01L 29/66545;
(Continued)

(56) References Cited

U.S. PATENT DOCUMENTS 7,453,108 B2    11/2008    Jin
8,338,895 B2    12/2012    Jin
(Continued)

FOREIGN PATENT DOCUMENTS

CN    102044289 A    5/2011
CN    103107072 A    5/2013
CN    105789312 A    7/2016

OTHER PUBLICATIONS

"Chinese Application Serial No. 201610153719.8, Office Action dated Mar. 28, 2018", w/ English Translation, (Mar. 28, 2018), 8 pgs.
(Continued)

*Primary Examiner* — Anthony Ho
(74) *Attorney, Agent, or Firm* — Schwegman Lundberg & Woessner, P.A.

(57) ABSTRACT

There are provided a Fin Field Effect Transistor (FinFET), a method of manufacturing the same, and an electronic device including the same. According to embodiments, the FinFET may include a fin formed on a substrate, a gate stack formed on the substrate and intersecting the fin, and a gate spacer formed on sidewalls of the gate stack. The gate spacer may include a dielectric material and a negative capacitance material.

22 Claims, 11 Drawing Sheets

(51) Int. Cl.
    *H01L 29/51* (2006.01)
    *H01L 21/8234* (2006.01)
(52) U.S. Cl.
    CPC .. *H01L 29/66545* (2013.01); *H01L 29/66795* (2013.01); *H01L 21/823431* (2013.01); *H01L 21/823437* (2013.01); *H01L 21/823468* (2013.01); *H01L 21/823475* (2013.01); *H01L 2029/7858* (2013.01)
(58) Field of Classification Search
    CPC ..... H01L 21/823468; H01L 21/823437; H01L 21/823431; H01L 21/823475; H01L 2029/7858
    See application file for complete search history.

(56) References Cited

U.S. PATENT DOCUMENTS

2015/0357440 A1   12/2015   Cheng et al.
2015/0364604 A1   12/2015   Su et al.

OTHER PUBLICATIONS

"International Application Serial No. PCT/CN2016/087240, International Search Report dated Dec. 21, 2016", w/ English Translation, (Dec. 21, 2016), 6 pgs.
"International Application Serial No. PCT/CN2016/087240, Written Opinion dated Dec. 21, 2016", (Dec. 21, 2016), 4 pgs.

FINFET, METHOD OF MANUFACTURING THE SAME, AND ELECTRONIC DEVICE INCLUDING THE SAME

CROSS-REFERENCE TO RELATED APPLICATIONS

This application claims priority to Chinese Patent Application No. 201610153719.8, filed on Mar. 17, 2016, entitled "FINFET, METHOD OF MANUFACTURING THE SAME, AND ELECTRONIC DEVICE INCLUDING THE SAME," which is incorporated herein by reference in its entirety.

TECHNICAL FIELD

The present disclosure relates to the field of semiconductors, and more particularly, to a Fin Field Effect Transistor (FinFET) capable of reducing a capacitance between components thereof, a method of manufacturing the same, and an electronic device including the same.

BACKGROUND

As components in an Integrated Circuit (IC) continues to increase in density, a spacing between the components is getting smaller and smaller. This causes an increase in parasitic capacitance between the respective components such as a gate electrode and a contact in the IC, and thus deteriorates the performance of the IC. On the other hand, even for devices with low performance requirements, it is also desirable to achieve low power consumption, and thus it is desirable to reduce the capacitance. One way to suppress this increase in the capacitance is to use an air gap between the components, but it may cause problems with mechanical and electrical stability.

Therefore, it is desirable to reduce the capacitance between the components while the spacing between the components continues to decrease.

SUMMARY

The present disclosure aims to provide, among others, a Field Effect Transistor (FinFET) capable of reducing a capacitance between components thereof, especially between a gate electrode and a contact, a method of manufacturing the same, and an electronic device including the same.

According to an aspect of the present disclosure, there is provided a FinFET, including: a fin formed on a substrate; a gate stack formed on the substrate and intersecting the fin; and a gate spacer formed on sidewalls of the gate stack, wherein the gate spacer includes a dielectric material and a negative capacitance material.

According to another aspect of the present disclosure, there is provided a method of manufacturing a FinFET, including: forming, on a substrate, a tin; forming, on the substrate, a gate stack intersecting the fin; and forming, on sidewalls of the gate stack, a gate spacer using a dielectric material and a negative capacitance material.

According to yet another aspect of the present disclosure, there is provided an electronic device comprising an integrated circuit including the FinFET.

According to embodiments of the present disclosure, the gate spacer comprises the dielectric material and the negative capacitance material, resulting in a positive capacitance and a negative capacitance between a gate electrode in the gate stack and a contact adjacent thereto. Due to the presence of the negative capacitance (especially in a case where the positive capacitance and the negative capacitance are connected in parallel), a total capacitance between the gate electrode and the contact can be reduced.

BRIEF DESCRIPTION OF DRAWINGS

The above and other objects, features, and advantages of the present disclosure will become apparent from following descriptions of embodiments of the present disclosure with reference to the attached drawings, in which.

DETAILED DESCRIPTION

Figure 1:
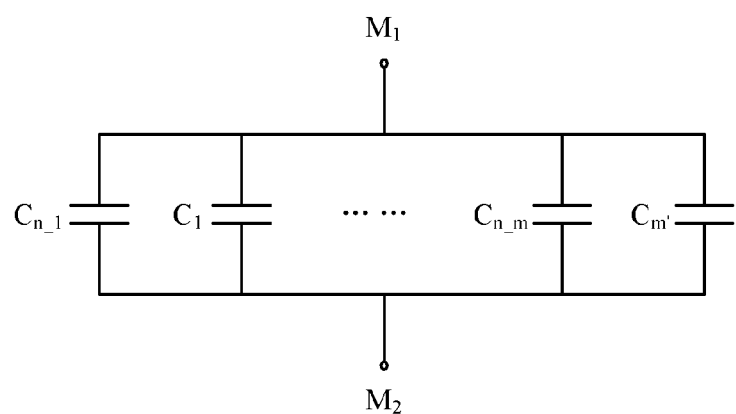
FIG. 1 is a schematic circuit diagram illustrating capacitances between a pair of components according to an embodiment of the present disclosure.

Hereinafter, embodiments of the present disclosure will be described with reference to the attached drawings. However, it should be understood that those descriptions are provided for illustrative purpose only, rather than limiting the scope of the present disclosure. Further, in the following, descriptions of known structures and techniques might be omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of different shapes, sizes, and relative positions as desired.

In the context of the present disclosure, when a layer/element is recited as being "on" a further layer/element, the layer/element may be disposed directly on the further layer/element, or otherwise there may be an intervening layer/element interposed therebetween. Further, if a layer/element is "on" a further layer/element in an orientation, then the layer/element may be "under" the further layer/element when the orientation is turned.

FIG. 1 is a schematic circuit diagram illustrating capacitances between a pair of components according to an embodiment of the present disclosure.

As shown in FIG. 1, in a semiconductor device such as a Fin Field Effect Transistor (FinFET), components $M_1$ and $M_2$ may be formed and may be electrically conductive, for example, by including a metal or metallic material. For example, the component $M_1$ may be a gate electrode (for example, a polysilicon gate or a metal gate), and the component $M_2$ may be a contact adjacent thereto (for example, a contact to a source/drain region corresponding to the gate electrode). Generally, in the semiconductor device, a dielectric material is filled between conductive regions. Due to this dielectric material, a (positive) capacitance may be created between the components $M_1$ and $M_2$.

Generally, a capacitor comprises a configuration of a plate-a dielectric material-a plate, in which the dielectric material may store charges. Conventional capacitors have a "positive" capacitance characteristic, that is, a voltage between the two plates increases as the charges stored in the dielectric material increase. In the present disclosure, such a dielectric material is referred to as a conventional dielectric material, or is simply referred to as a dielectric material, as is conventional in the art. In contrast, some materials may exhibit a "negative" capacitance characteristic in some conditions, that is, the voltage between the plates decreases as the charges stored therein increase. Such materials are referred to as "negative capacitance materials." For example, some ferroelectric materials (for example, materials containing Hf, Zr, Ba, or Sr, such as $HfZrO_2$, $BaTiO_3$, $KH_2PO_4$, or NBT, or any combination thereof) may be polarized if a critical electric field is reached. The polarization results in that a large amount of bound charges are accumulated instantaneously on a surface of the material, thereby causing a voltage across the ferroelectric material to decrease.

According to an embodiment of the present disclosure, such a negative capacitance may be used to compensate for the positive capacitance to reduce a total capacitance between the components. FIG. 1 illustrates positive capacitances $C_1, \ldots, C_{m'}$ due to a dielectric material between the components $M_1$ and $M_2$ and negative capacitances $C_{n\_1}, \ldots, C_{n\_m}$ for compensating for the positive capacitances, where in is a positive integer greater than or equal to 1, and m' is a positive integer greater than or equal to 1. Such negative capacitances may be obtained by, for example, introducing a negative capacitance material between the components $M_1$ and $M_2$ (for example, by introducing the negative capacitance material in a gate spacer as described below). In this example, these capacitances are shown in a parallel configuration.

Due to the parallel configuration, a total capacitance $C_t$ between the components $M_1$ and $M_2$ may be expressed as:

$$C_t = \sum_{i=1}^{m'} C_i - \sum_{i=1}^{m} |C_{n\_1}|.$$

It can be seen that due to the presence of the negative capacitances, the total capacitance $C_t$ can be reduced, even to be close to 0 (zero), as compared with a case where there is only the dielectric material between the components $M_1$ and $M_2$. Preferably, $C_t \geq 0$ holds to maintain the device to be electrically stable.

As can be seen from the above, by introducing the negative capacitance material together with the dielectric material between the components, the capacitance between the components may be suppressed. In a case of a gate electrode and a contact, particularly in a case where a self-aligned contact is formed so that the contact is in physical contact with a gate spacer, the gate spacer is sandwiched between the gate electrode and the contact, and thus the negative capacitance material may be introduced into the gate spacer. In order to effectively ensure such a capacitance suppression effect, the positive capacitance(s) and the negative capacitance(s) are preferably connected in parallel with each other. For example, the gate spacer may have a portion thereof formed on a portion of sidewalls of the gate stack from the dielectric material and another portion thereof formed on another portion of the sidewalls of the gate stack from the negative capacitance material. For example, the portion of the gate spacer of the dielectric material and the other portion of the gate spacer of the negative capacitance material may be stacked on top of each other along the sidewalls of the gate stack. Thus, both the portion of the gate spacer of the dielectric material and the other portion of the gate spacer of the negative capacitance material are sandwiched between the gate electrode and the contact, and positive capacitance(s) and negative capacitance(s) caused thereby respectively both take the gate electrode and the contact as plates. That is, the positive capacitance(s) and the negative capacitance(s) may share the same plates and thus may be connected in parallel with each other.

Such a FinFET may be manufactured, for example, as follows. Specifically, a fin may be formed on a substrate. For example, a protruding fin which linearly extends may be formed by patterning the substrate. A gate stack intersecting the fin may then be formed on the substrate. For example, the gate stack may be formed by forming a gate dielectric layer on the substrate and forming a gate electrode layer on the gate dielectric layer. Then, a gate spacer may be formed on sidewalls of the gate stack. As described above, both the dielectric material and the negative capacitance material may be used here to form the gate spacer. For example, a portion of the gate spacer may be formed on a portion of the sidewalls of the gate stack using the dielectric material, and another portion of the gate spacer may be formed on another portion of the sidewalls of the gate stack using the negative capacitance material. The two portions of the gate spacer may be stacked on top of each other.

This form of gate spacer may be manufactured, for example, as follows. Specifically, a preliminary spacer may firstly be formed along the sidewalls of the gate stack (for example, in substantially the entire height thereof) using the dielectric material. Then, an upper portion of the preliminary spacer having a certain height may be removed to obtain the portion of the gate spacer. Then, the other portion of the gate spacer may be formed on the portion of the gate spacer using the negative capacitance material. In order to facilitate the removal of the preliminary spacer and the formation of the spacer of the negative capacitance material, after the preliminary spacer is formed, a shielding layer may be formed on the substrate to expose the portion of the preliminary spacer having the height and shield remaining portions of preliminary spacer. Then, the exposed portion of the preliminary spacer may be removed by selective etching. Next, the spacer of the negative capacitance material may be formed with the shielding layer still remaining. According to an embodiment of the disclosure, the material of the spacer may be as follows, for example. A portion of the spacer above the fin may be formed of the negative capacitance material, and the remaining portion of the spacer on opposite sides of the fin may comprise an upper portion and a lower portion, which may be a spacer of the negative capacitance material and a spacer of the conventional dielectric material, respectively.

The techniques of the present disclosure may be presented in various ways, some of which will be described below.

FIGS. 2(a)-8(b) are sectional views illustrating some of stages in a flow of manufacturing a semiconductor device according to an embodiment of the present disclosure.

Figure 2A:
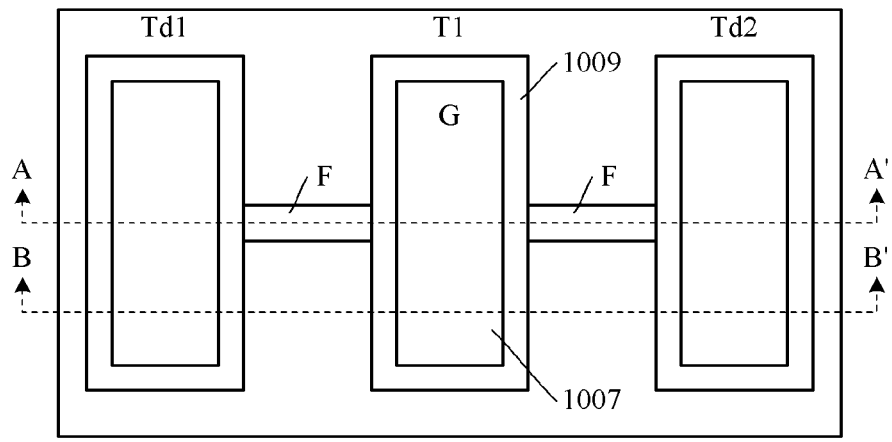
FIGS. 2(a)-8(b) are sectional views illustrating some of stages in a flow of manufacturing a FinFET according to an embodiment of the present disclosure.
Figure 2B:
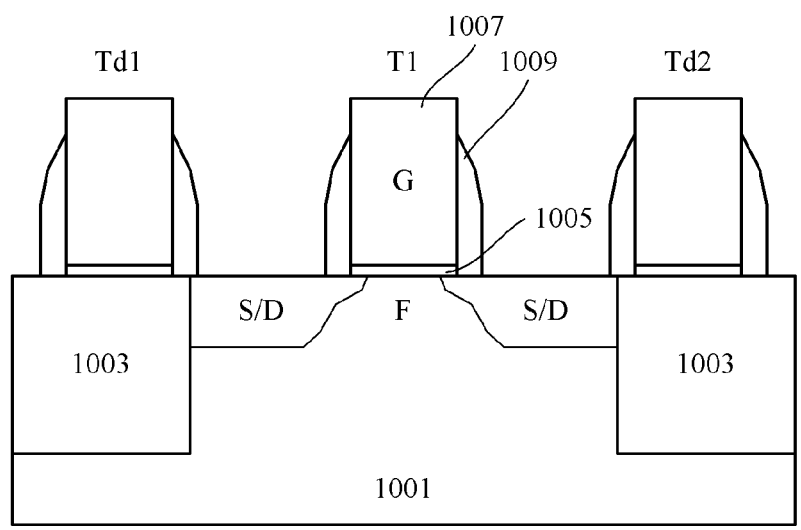
Figure 2C:
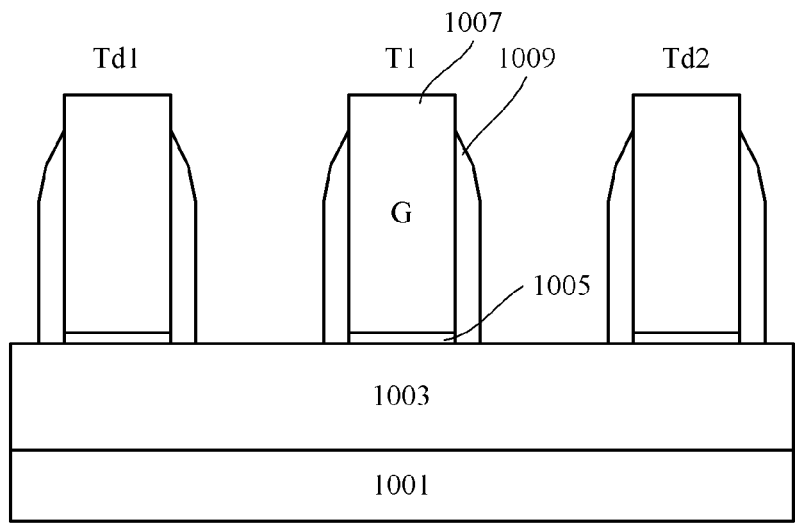

As shown in FIGS. 2(a), 2(b), and 2(c) (FIG. 2(a) is a top view, FIG. 2(b) is a sectional view taken along line AA' in FIG. 2(a), and FIG. 2(c) is a sectional view taken along line BB' in FIG. 2(a)), a substrate 1001 is provided. Here, a silicon wafer will be described by way of example. However, the present disclosure is not limited thereto, but is applicable to various forms of substrates such as a germanium substrate, a Semiconductor-On-Insulator (SOI) substrate, a compound semiconductor substrate, or the like. A Shallow Trench Isolation (STI) 1003 may be formed in the substrate 1001 to define an active region.

A desired device such as a Fin Field Effect Transistor (FinFET) T1 or the like may be formed on the substrate 1001. The FinFET T1 may comprise a fin F formed on the substrate 1001 and extending in a first direction (in this example, the horizontal direction shown in FIG. 2(*a*)) and a gate stack extending in a second direction (in this example, the vertical direction shown in FIG. 2(*a*)) crossing (for example, perpendicular to) the first direction to intersect the fin F. The gate stack may comprise a gate dielectric layer 1005 and a gate electrode layer (G) 1007 which are sequentially stacked on a surface of the substrate. For example, the gate dielectric layer 1005 may comprise oxide (for example, silicon oxide) or a high-K gate dielectric such as $HfO_2$; and the gate electrode layer 1007 may comprise polysilicon or a metal gate electrode. In addition, Source/Drain (S/D) regions may be formed at opposite ends of the fin F (on opposite sides of the gate stack, respectively).

There are a variety of ways in the art to form such a FinFET, such as the gate-first process or the gate-last process.

A dielectric (preliminary) spacer 1009 may be formed on sidewalls of the gate stack. There are various ways in the art to form the spacer. For example, a dielectric layer having a certain thickness may be deposited in a substantially conformal manner on the substrate with the gate stack (which may be a sacrificial gate stack in a case of the gate-last process) formed thereon, and then the deposited dielectric layer is subjected to Reactive Ion Etching (RIE) in a direction substantially perpendicular to the surface of the substrate to remove laterally extending portions thereof so that vertically extending portions thereof are left, resulting in the spacer. For example, the spacer 1009 may comprise nitride (for example, silicon nitride).

In this embodiment, in order to be compatible with a process of forming self-aligned contacts as described below, dummy devices Td1 and Td2 may also be formed on opposite sides (left and right sides in the figure) of the device T1. For example, such dummy devices Td1 and Td2 may be formed on the STI 1003 and may comprise substantially the same configuration as that of the device T1. These dummy devices Td1 and Td2 may be formed on the substrate 1001 in the same process as the device T1.

Next, a portion of the spacer 1009 (in this example, an upper portion thereof) may be removed to form a positive capacitance spacer.

Figure 3:
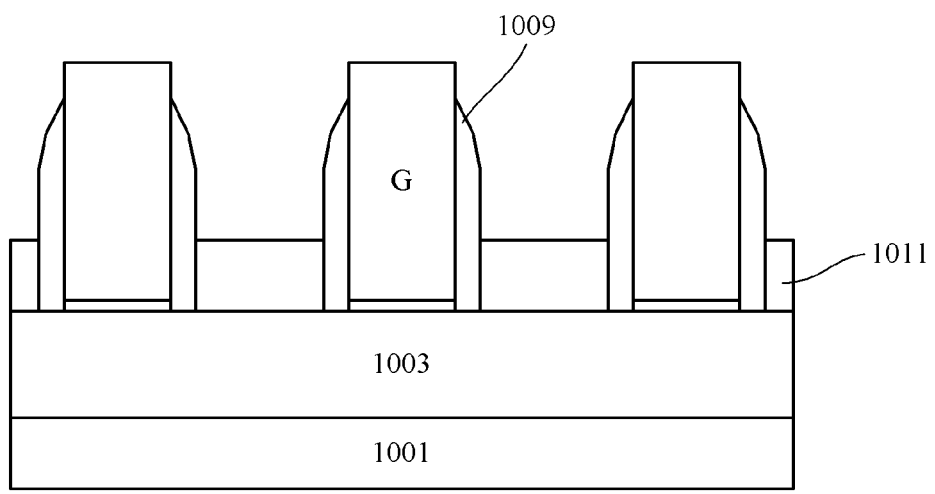

To this end, as shown in FIG. 3 (a sectional view taken along line BB' in FIG. 2(*a*)), a shielding layer 1011 may be formed on the substrate. For example, a shielding material, such as oxide, may be formed by deposition. The deposited shielding material may be planarized by, for example, CMP. The CMP may stop at the gate electrode G. Thus, the deposited shielding material may fill into gaps between the respective gate stacks. Next, the deposited shielding material may be etched back to obtain the shielding layer 1011. For example, it may be etched back by selective etching such as RIE. An amount of the shielding material to be etched back is controlled so that a portion of the spacer which is shielded by the shielding layer 1011 after the back-etching has a desired height.

Figure 4A:
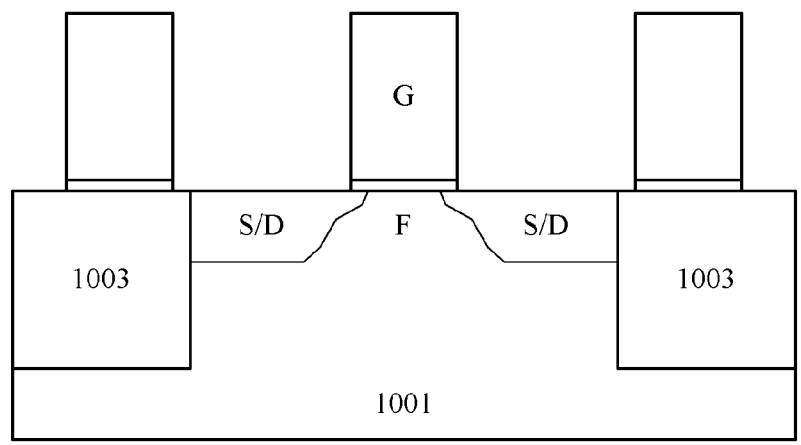
Figure 4B:
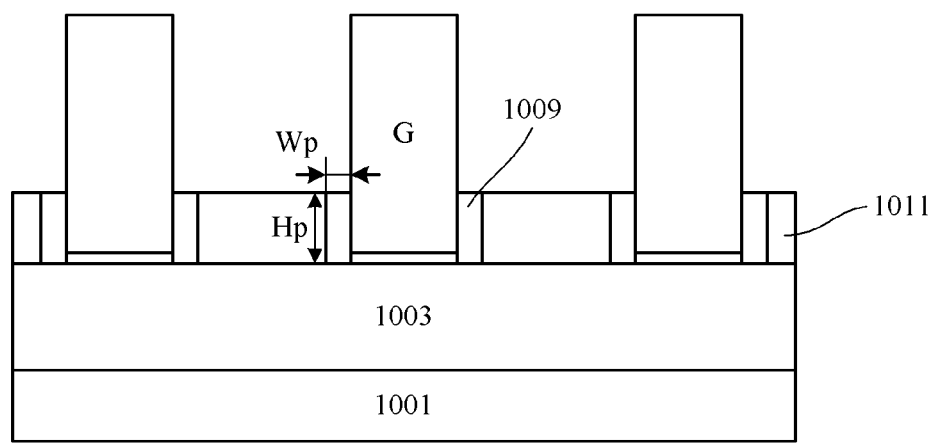

Then, as shown in FIG. 4(*a*) (a sectional view taken along line AA' in FIG. 2(*a*)) and FIG. 4(*b*) (a sectional view taken along line BB' in FIG. 2(*a*)), the exposed portion of the spacer 1009 may be removed by selective etching (for example, wet etching, by using, for example, hot phosphoric acid). Thus, a portion of the spacer 1009 is left on the sidewalls of the gate stack, to form a positive capacitance spacer. As shown in the figure, the remaining portion of the spacer 1009 may have a certain height (a dimension in the vertical direction in the figure) Hp and a certain width (a dimension in the horizontal direction in the figure) Wp. The height Hp and the width Wp may be adjusted by adjusting process parameters. For example, the height Hp may be controlled by controlling the amount of the shielding layer 1011 to be etched back, and the width Wp may be adjusted by controlling the thickness of the dielectric layer deposited in the process of forming the spacer.

In this example, it is shown that the spacer 1009 no longer exists on the sidewalls of the gate stack over a top surface of the fin F. However, the present disclosure is not limited thereto. Depending on the height Hp (in other words, the height of the shielding layer 1011), the spacer 1009 may also be left on the sidewalls of the gate stack over the top surface of the fin F.

Next, a negative capacitance spacer may be formed on the positive capacitance spacer thus formed.

To this end, as shown in FIG. 5(*a*) (a sectional view taken along line AA' in FIG. 2(*a*)) and FIG. 5(*b*) (a sectional view taken along line BB' in FIG. 2(*a*)), a spacer 1013 may be formed on sidewalls of the exposed portion of the gate stack through the spacer fabrication process using a negative capacitance material, such as $HfZrO_2$. For example, the negative capacitance material layer may be deposited in a substantially conformal manner on the structure shown in FIGS. 4(*a*) and 4(*b*), and then the deposited negative capacitance material is subjected to RIE in a direction substantially perpendicular to the surface of the substrate to remove laterally extending portions thereof so that vertically extending portions thereof are left, thereby obtaining the spacer 1013. As shown in the figure, the negative capacitance spacer 1013 may have a certain height (a dimension in the vertical direction in the figure) Hn and a certain width (a dimension in the horizontal direction in the figure) Wn. The height Hn and the width Wn may be adjusted by adjusting process parameters. For example, the height Hn may be controlled by controlling an amount of the negative capacitance material layer to be etched by RIE when the spacer is being formed, and the width Wn may be adjusted by controlling the thickness of the deposited negative capacitance dielectric layer.

Thus, a final gate spacer is formed on the sidewalls of the gate stack. The gate spacer comprises the spacer 1009 of the dielectric material and the spacer 1013 of the negative capacitance material.

Although in this example, the spacer of the dielectric material is formed before the spacer of the negative capacitance material, the present disclosure is not limited thereto. For example, the spacer of the negative capacitance material may be formed (by, for example, making the preliminary spacer 1009 from the negative capacitance material) before the spacer of the dielectric material is formed (by, for example, making the spacer 1013 from the dielectric material). In this way, it is also possible to achieve the gate spacer comprising both the positive capacitance spacer and the negative capacitance spacer, except that an order in which the positive capacitance spacer and the negative capacitance spacer are stacked is different.

Then, contacts may be formed. Here, the contacts are formed in a self-aligned manner. However, the present disclosure is not limited thereto.

Figure 5A:
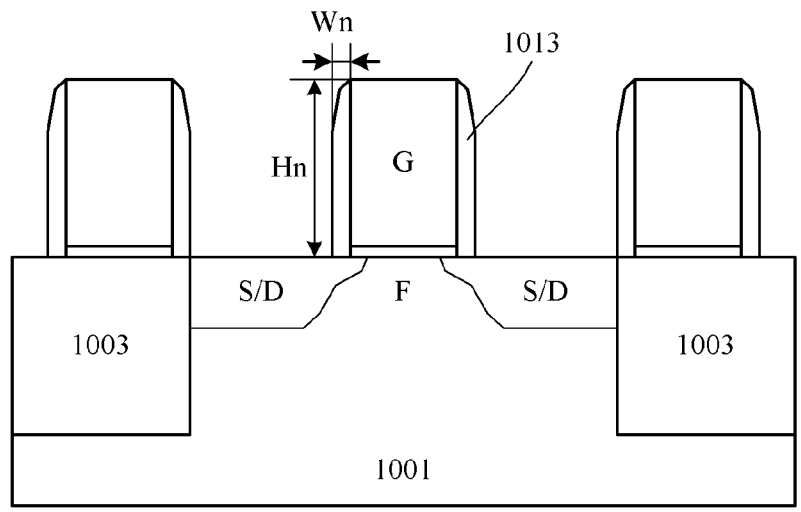
Figure 5B:
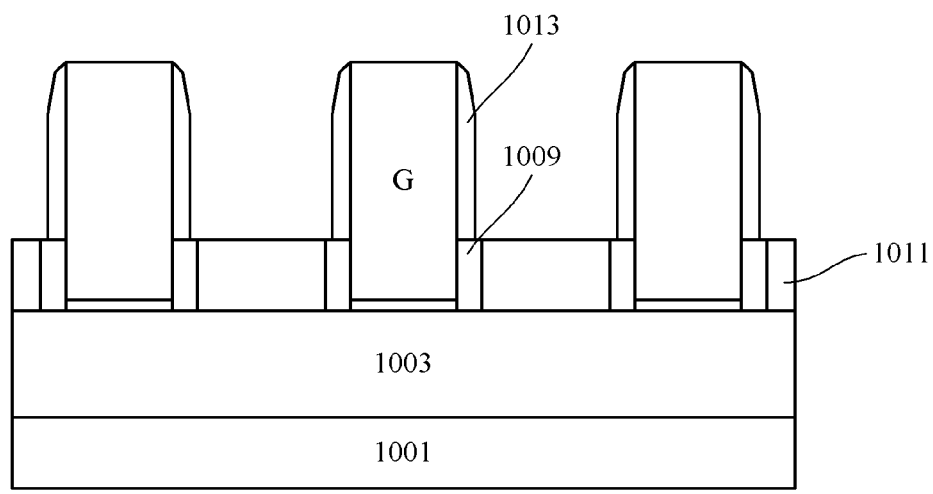
Figure 6A:
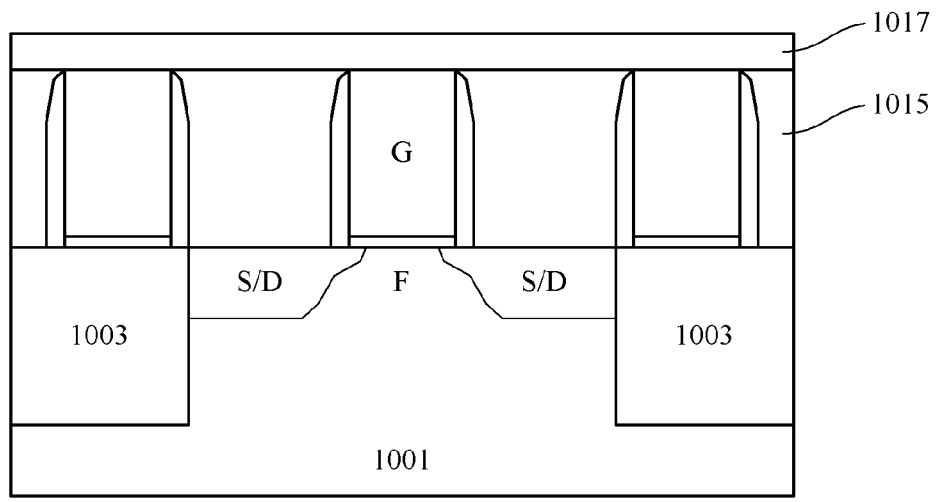
Figure 6B:
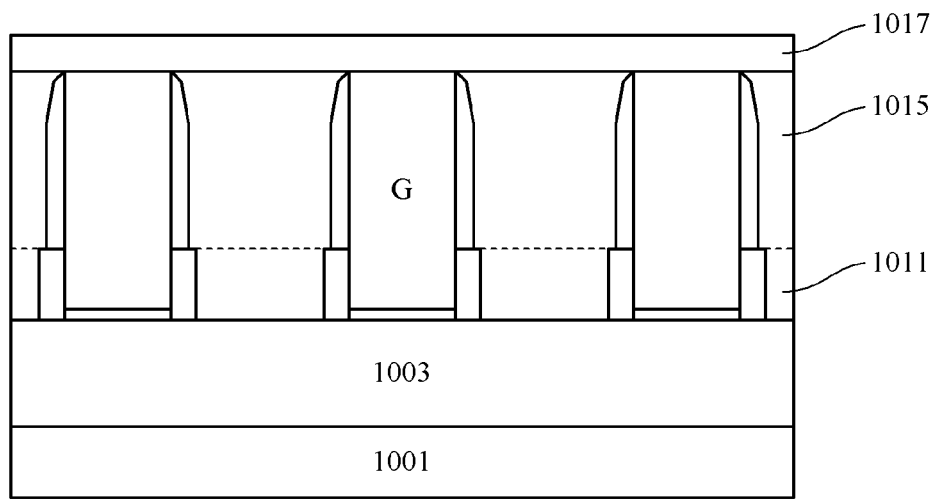

To this end, as shown in FIG. 6(a) (a sectional view taken along line AA' in FIG. 2(a)) and FIG. 6(b) (a sectional view taken along line BB' in FIG. 2(a)), an interlayer dielectric layer 1015 may be deposited on the structure shown in FIGS. 5(a) and 5(b). For example, the interlayer dielectric layer 1015 may comprise oxide. In a case where the shielding layer 1011 also comprises oxide as described above, the shielding layer 1011 may be left as a portion of the interlayer dielectric layer, and then they are collectively shown as 1015. In FIG. 6(b), as the interlayer dielectric layer 1015 and the shielding layer 1011 both comprise oxide, an interface therebetween is shown as a broken line. However, it is to be noted that the present disclosure is not limited thereto. For example, the shielding layer 1011 may be removed firstly (by, for example, selective etching), and then the interlayer dielectric layer 1015 may be deposited. The deposited interlayer dielectric layer 1015 may be planarized by, for example, Chemical Mechanical Polishing (CMP). The CMP may stop at the gate electrode G.

In this example, due to the presence of the dummy devices Td1 and Td2, in order to avoid forming a contact where it is unnecessary, a shielding layer 1017 may be formed on the planarized interlayer dielectric layer 1015. For example, the shielding layer 1017 may comprise nitride, with a thickness of about 20-30 nm.

Figure 7A:
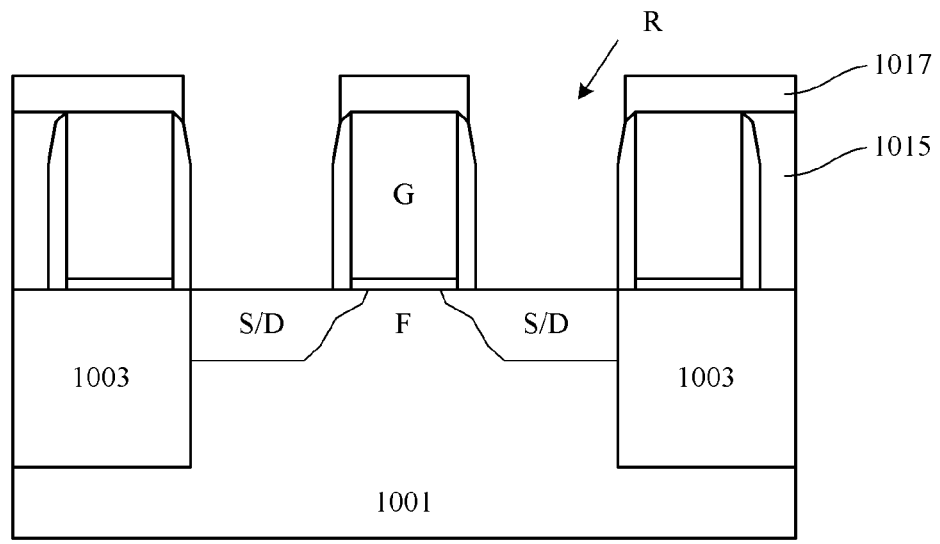
Figure 7B:
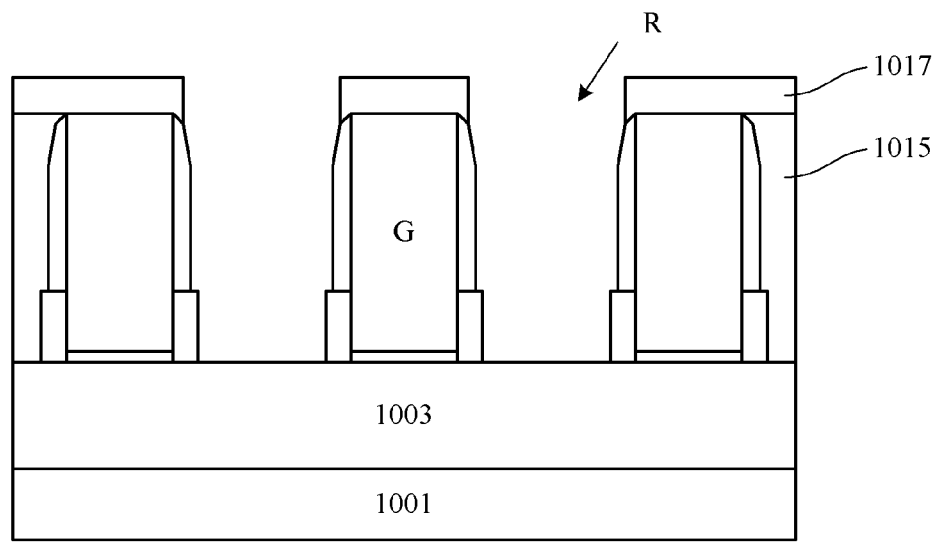

Then, as shown in FIG. 7(a) (a sectional view taken along line AA' in FIG. 2(a)) and FIG. 7(b) (a sectional view taken along line BB' in FIG. 2(a)), for example, openings may be formed by lithography at positions in the shielding layer 1017 which correspond to the Source/Drain (S/D) regions to expose spaces between the gate spacers. For example, sidewalls of the openings in the shielding layer 1017 may be located on the gate spacers. Preferably, the sidewalls of the openings project outwardly relative to the respective gate stacks to avoid unnecessary short circuits between the contacts to be subsequently formed at the positions of the openings and the gate electrode. Then, the interlayer dielectric layer 1015 may be selectively etched by, for example, RIE through the openings in the shielding layer 1017, to remove portions of the interlayer dielectric layer between the gate spacers, thereby forming contact holes R between adjacent ones of the gate spacers.

For the dummy devices Td1 and Td2, they have no source/drain regions actually formed, and thus need no contacts in fact. The shielding layer 1017 may shield a region where it is not necessary to form a contact. Of course, the shielding layer 1017 may not be provided, but the interlayer dielectric layer 1015 may be selectively etched directly. Thus, contact holes may also be formed on opposite sides of the dummy devices Td1 and Td2. Alternatively, the interlayer dielectric layer 1015 may even not be formed, and instead after the gate spacers are formed (and the shielding layer 1011 is removed), contacts may be directly formed between the gate stacks and may be electrically isolated where it is necessary.

Figure 8A:
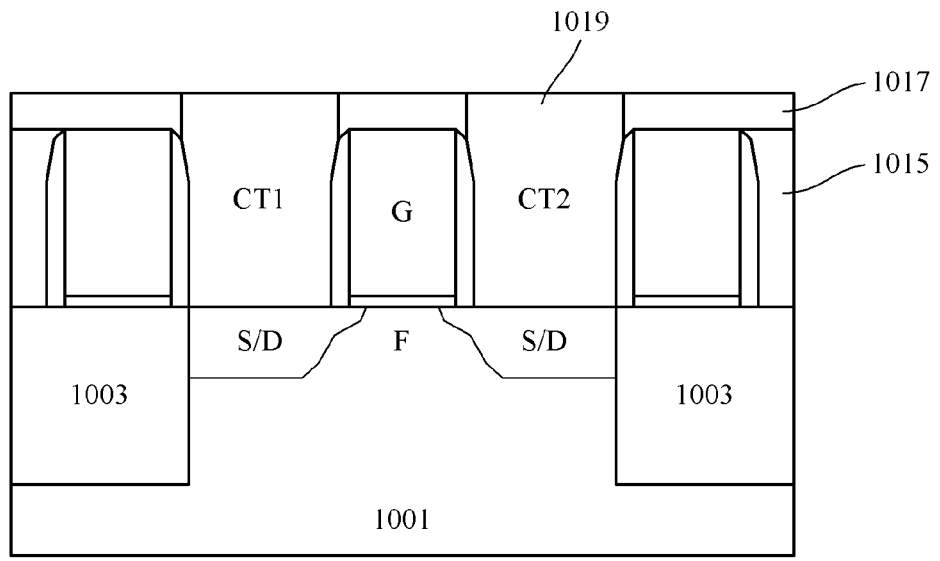
Figure 8B:
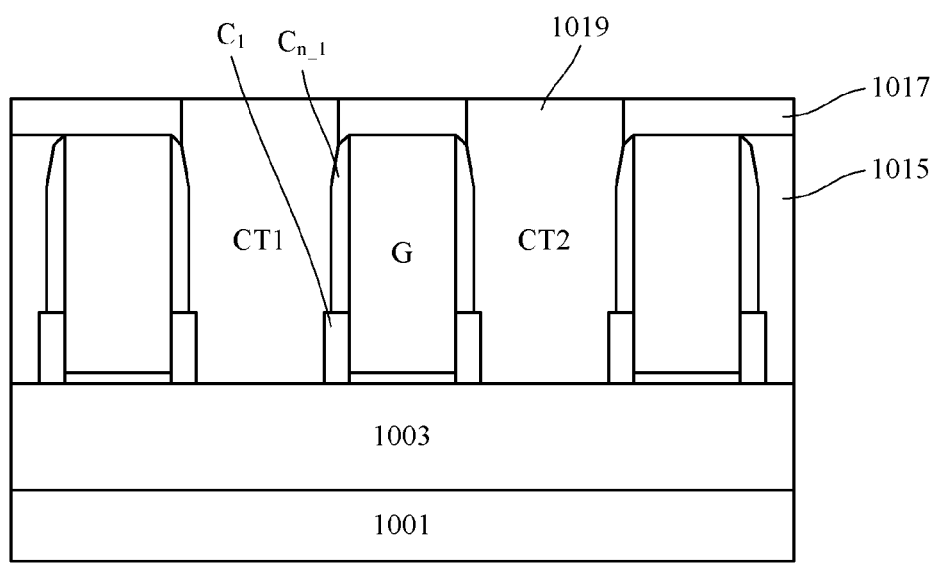

Then, as shown in FIG. 8(a) (a sectional view taken along line AA' in FIG. 2(a)) and FIG. 8(b) (a sectional view taken along line BB' in FIG. 2(a)), contacts 1019 may be formed by filling a conductive material, for example, metal such as W in the contact holes R. Here, contacts CT1 and CT2 corresponding to the Source/Drain (S/D) regions are shown. The conductive material may be filled in the contact holes R by, for example, filling the conductive material in the structure shown in FIGS. 7(a) and 7(b) to at least completely fill up the contact holes R, and then planarizing the deposited conductive material by, for example, CMP (the CMP may stop at the shielding layer 1017). Before the conductive material is filled, a diffusion barrier layer such as TiN may also be formed in the contact holes.

Here, the gate electrode G and the contact CT1 are considered. As they are opposed to each other and there are the dielectric material and the negative capacitance material therebetween, a capacitance $C_t$ may be created therebetween. Here, the capacitance $C_t$ comprises a negative capacitance $C_{n\_1}$ caused by the spacer of the negative capacitance material and a positive capacitance $C_1$ caused by the spacer of the dielectric material. In addition, as these capacitances share the same plates G and CT1, they are in a parallel relationship. Therefore, as described above, the total capacitance $C_t = C_1 - |C_{n\_1}|$ is reduced as compared with a case where the gate spacer is formed entirely of the dielectric material. In this example, the capacitance may be adjusted in value by adjusting at least one of the height Hp and the width Wp of the spacer of the dielectric material and the height Hn and the width Wn of the spacer of the negative capacitance material, to make $C_t$ close to zero (but preferably greater than zero). Of course, it is also possible to select a material having an appropriate (positive/negative) dielectric constant to adjust the capacitance value. The same is true for the capacitance between the gate electrode G and the contact CT2.

Although Td1 and Td2 are illustrated as dummy devices in the above description, the present disclosure is not limited thereto. For example, at least one of Td1 and Td2 may be a device which actually functions like T1. In this case, the contact formed in the space between Td1 (and/or Td2) and T1 are shared by Td1 (and/or Td2) and T1, so that their source/drain regions are connected to each other through the common contact.

Further, although the contact is illustrated above as a self-aligned one, the present disclosure is not limited thereto. For example, the contact may be formed by filling a conductive material such as metal in a hole formed in the dielectric layer. Even in this case, the configuration of the gate spacer according to the embodiment of the present disclosure can also reduce the parasitic capacitance between the contact and the gate electrode.

FIGS. 9(a)-11(b) are sectional views illustrating some of stages in a flow of manufacturing a FinFET according to another embodiment of the present disclosure, wherein the same reference signs as those in FIGS. 2(a)-8(b) are used to indicate the same components. This embodiment is substantially the same as the above embodiment, except that a negative capacitance material layer is further formed on the top of the gate stack.

Figure 9A:
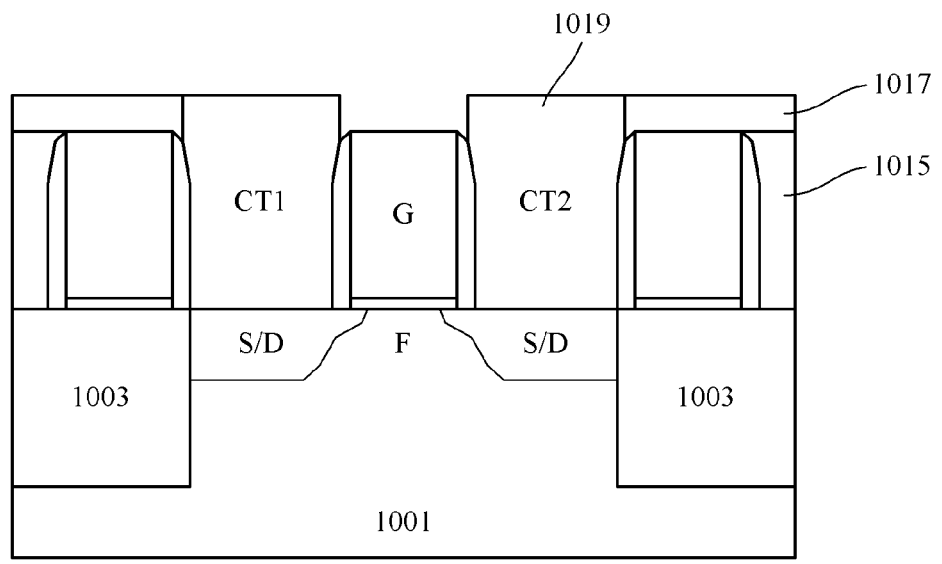
FIGS. 9(a)-11(b) are sectional views illustrating some of stages in a flow of manufacturing a FinFET according to another embodiment of the present disclosure.
Figure 9B:
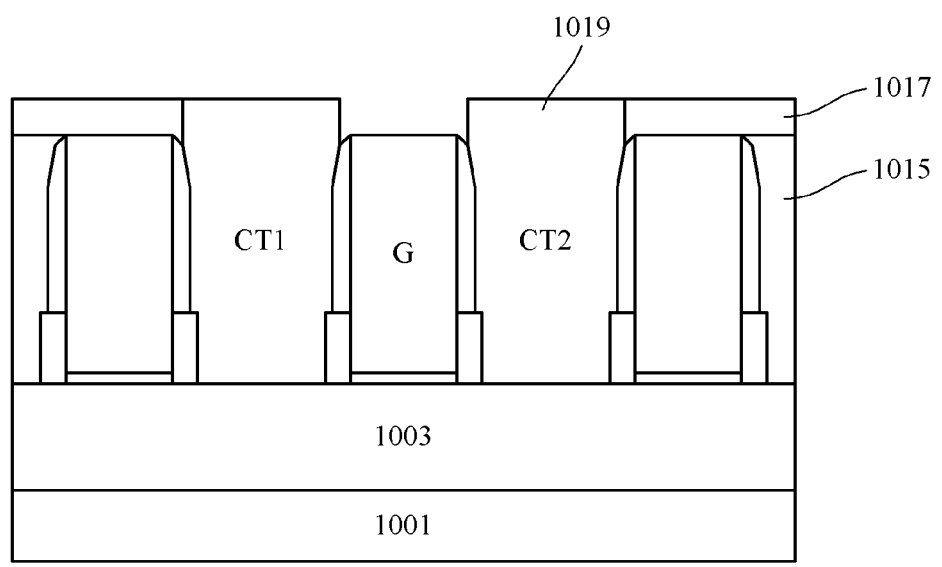

Specifically, according to the flow described above with reference to FIGS. 2(a)-8(b), after the structure shown in FIGS. 8(a) and 8(b) is obtained, as shown in FIG. 9(a) (a sectional view taken along line AA' in FIG. 2(a)) and FIG. 9(b) (a sectional view taken along line BB' in FIG. 2(a)), the shielding layer 1017 may be removed by selective etching. Thus, the gate electrode G is exposed. Here, only a case where a portion of the shielding layer 1017 on the device T1 is removed is shown (for example, this may be achieved by covering the shielding layer 1017 with photoresist except for the portion of the shielding layer on T1, and then selectively etching the shielding layer 1017.) Of course, remaining portions of the shielding layer 1017 (for example, portions on Td1 and/or Td2) may also be removed.

Figure 10A:
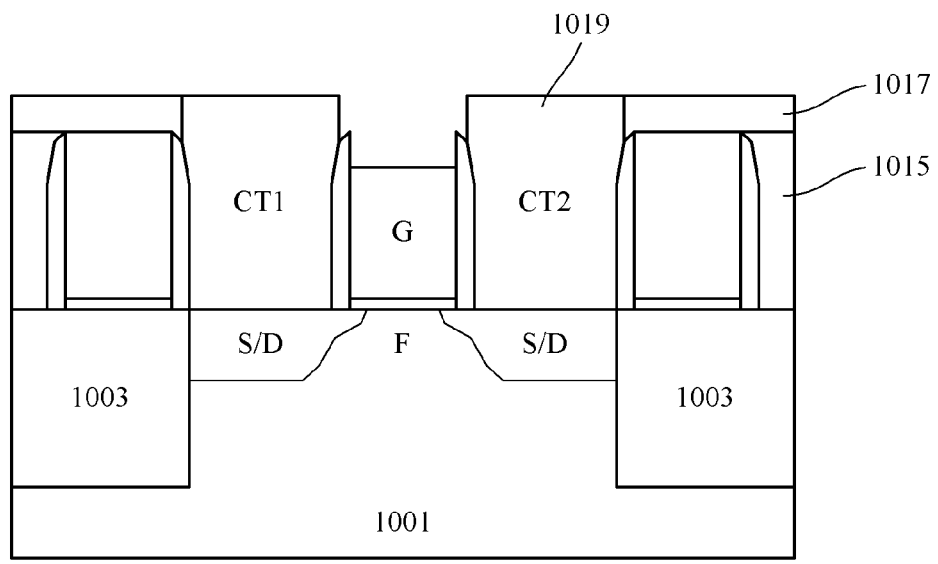
Figure 10B:
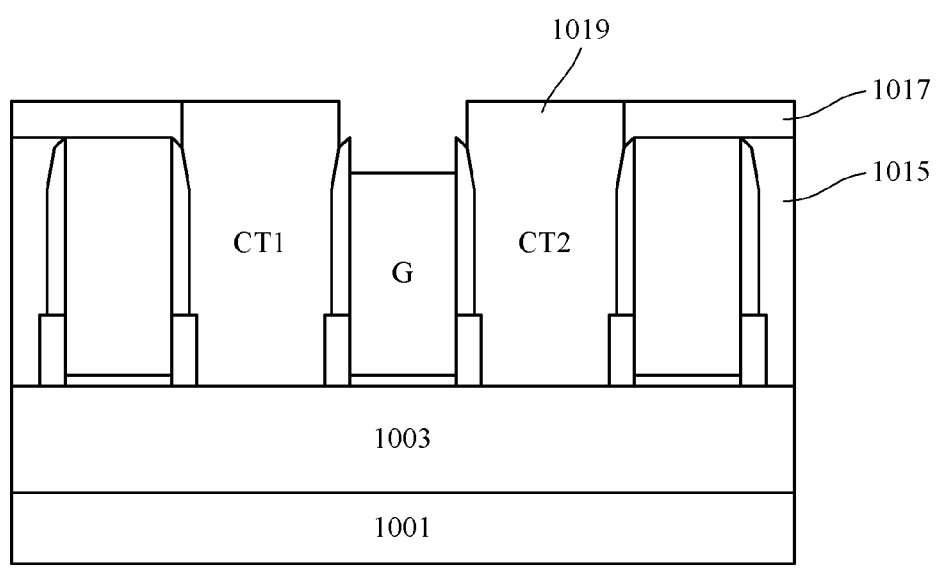

Preferably, in order to avoid unnecessary short circuits between the contacts and the gate electrode, the gate electrode may be further recessed. Specifically, as shown in FIG. 10(a) (a sectional view taken along line AA' in FIG. 2(a)) and FIG. 10(b) (a sectional view taken along line BB' in FIG.

2(a)), the gate electrode G may be recessed downward to a certain extent by, for example, selective etching.

Figure 11A:
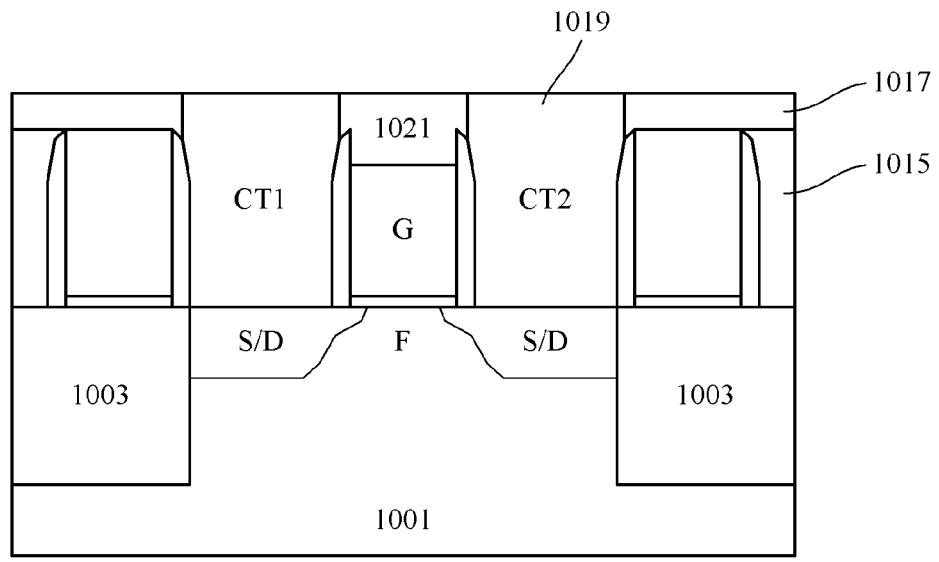
Figure 11B:
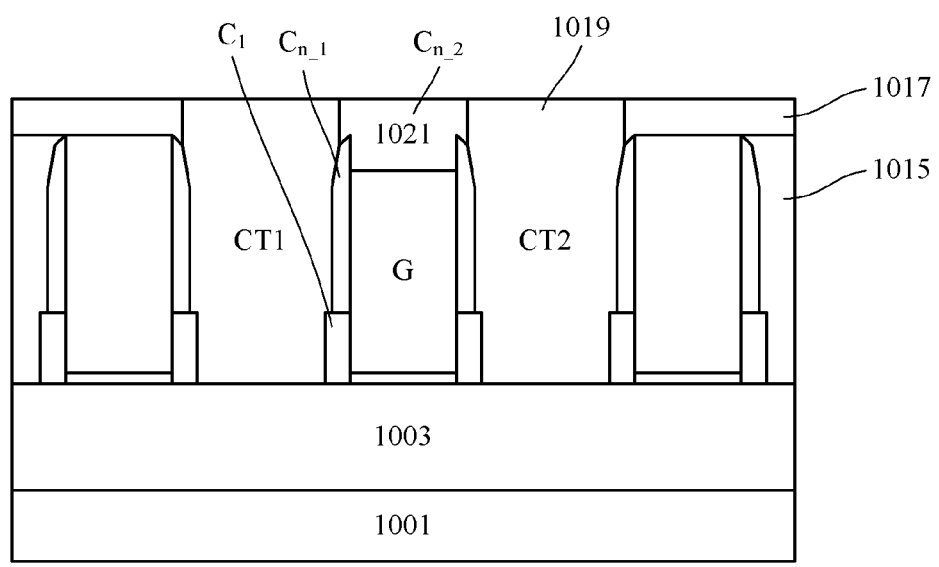

Next, as shown in FIG. 11(a) (a sectional view taken along line AA' in FIG. 2(a)) and FIG. 11(b) (a sectional view taken along line BB' in FIG. 2(a)), a negative dielectric layer 1021 may be formed in a space left by the removal of the shielding layer 1017 (and a recess caused by the gate electrode). For example, this may be achieved by depositing a negative dielectric material on the structure shown in FIGS. 10(a) and 10(b) and planarizing the deposited negative dielectric material by, for example, CMP (the CMP may stop at the contacts.)

As described above, due to the form of gate spacer, there are a negative capacitance $C_{n\_1}$ and a positive capacitance $C_1$ between the gate electrode G and the contact CT1. In addition, due to the negative capacitance material layer 1021, there is also a negative capacitance $C_{n\_2}$ between the gate electrode G and the contact CT1. Therefore, the total capacitance $C_t = C_1 - |C_{n\_1}| - |C_{n\_2}|$, which is reduced as compared with a case where the gate spacer is formed entirely of the dielectric material and also has its top covered by the dielectric material (such as the above-described shielding layer 1017). Here, in addition to one or more of Hp, Wp, Hn and Wn as described above, a thickness of the negative capacitance material layer 1021 (a dimension in the vertical direction in the figure) may be adjusted (this may be achieved by, for example, adjusting the extent to which the gate is recessed) to adjust the capacitance value, to make $C_t$ close to zero (but preferably greater than zero). Of course, it is also possible to select a material having an appropriate (positive/negative) dielectric constant to adjust the capacitance value.

In this example, as the gate electrode G is recessed with respect to the spacer, unnecessary short circuits between the gate electrode and the contacts can be effectively suppressed.

The FinFETs according to the embodiments of the present disclosure are applicable to various electronic devices. For example, an Integrated Circuit (IC) may be formed by integrating a plurality of such FinFETs and other devices (for example, transistors in other forms or the like), from which an electronic device may be made. Therefore, the present disclosure further provides an electronic device comprising the above semiconductor device. The electronic device may also comprise components such as a display operatively coupled to the integrated circuit and a wireless transceiver operatively coupled to the integrated circuit. Such an electronic device may comprise, for example, a smart phone, a tablet Personal Computer (PC), a Personal Digital Assistant (PDA), etc.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided only for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

The invention claimed is:

1. A Fin Field Effect Transistor (FinFET), comprising:
   a fin formed on a substrate;
   a gate stack formed on the substrate and intersecting the fin; and
   a gate spacer formed on sidewalls of the gate stack, wherein the gate spacer comprises a dielectric material and a negative capacitance material.

2. The FinFET according to claim 1, wherein the gate spacer comprises a layer of the dielectric material formed on a portion of the sidewalls of the gate stack and a layer of the negative capacitance material formed on another portion of the sidewalls of the gate stack.

3. The FinFET according to claim 2, wherein the portion of the sidewalls is closer to the substrate than the other portion of the sidewalls, or vice versa.

4. The FinFET according to claim 3, wherein a portion of the gate spacer above a top surface of the fin is formed of the negative capacitance material, and the remaining portion of the gate spacer has a lower portion formed of the dielectric material and an upper portion formed of the negative capacitance material.

5. The FinFET according to claim 1, further comprising a negative capacitance material layer formed on the top of the gate stack.

6. The FinFET according to claim 5, wherein a gate electrode in the gate stack is recessed towards the substrate with respect to a top end of the gate spacer, and a resulting recess is filled with the negative capacitance material layer formed on the top of the gate stack.

7. The FinFET according to claim 1, further comprising:
   a source region and a drain region formed on opposite ends of the fin, respectively; and
   contacts to the source region and the drain region, respectively.

8. The FinFET according to claim 7, wherein the contacts are bounded at least partially by the gate spacer.

9. The FinFET according to claim 7, wherein a total capacitance between the contacts and the gate electrode in the gate stack due to the dielectric material and the negative capacitance material is less than a capacitance that would occur in a case where the gate spacer is formed of the dielectric material only, and is greater than 0.

10. The FinFET according to claim 1, wherein the negative capacitance material is a material containing Hf, Zr, Ba or Sr.

11. The FinFET according to claim 10, wherein the negative capacitance material comprises $HfZrO_2$, $BaTiO_3$, $KH_2PO_4$, NBT or any combination thereof.

12. An electronic device, comprising an integrated circuit comprising the FinFET according to claim 1.

13. The electronic device according to claim 12, further comprising a display operatively coupled to the integrated circuit and a wireless transceiver operatively coupled to the integrated circuit.

14. A method of manufacturing a Fin Field Effect Transistor (FinFET), comprising:
   forming, on a substrate, a fin;
   forming, on the substrate, a gate stack intersecting the fin; and
   forming, on sidewalls of the gate stack, a gate spacer using a dielectric material and a negative capacitance material.

15. The method according to claim 14, wherein the forming a gate spacer comprises:
　　forming, on a portion of the sidewalls of the gate stack, a portion of the gate spacer using the dielectric material; and
　　forming, on another portion of the sidewalls of the gate stack, another portion of the gate spacer using the negative capacitance material.

16. The method according to claim 15, wherein
　the forming a portion of the gate spacer comprises:
　　forming a preliminary spacer using the dielectric material along the sidewalls of the gate stack; and
　　removing an upper portion of the preliminary spacer having a certain height to obtain the portion of the gate spacer, and
　the forming another portion of the gate spacer comprises:
　　forming, on the portion of the gate spacer, the other portion of the gate spacer using the negative capacitance material.

17. The method according to claim 16, wherein the removing an upper portion of the preliminary spacer having a certain height comprises:
　　forming, on the substrate, a shielding layer which exposes the upper portion of the preliminary spacer having the certain height, and shields remaining portions of the preliminary spacer; and
　　removing the exposed portion of the preliminary spacer by selective etching.

18. The method according to claim 17, wherein the forming a shielding layer comprises:
　　depositing a shielding material on the substrate and planarizing the deposited shielding material, wherein the planarizing process stops at the top of the gate stack; and
　　etching back the planarized shielding material to expose the upper portion of the preliminary spacer having the certain height.

19. The method according to claim 14, further comprising:
　　forming a negative capacitance material layer on the top of the gate stack.

20. The method according to claim 19, further comprising:
　　recessing a gate electrode in the gate stack towards the substrate with respect to a top end of the gate spacer, wherein a resulting recess is filled with the negative capacitance material layer formed on the top of the gate stack.

21. The method according to claim 14, wherein there are a plurality of the gate stacks on the substrate, and the method further comprises:
　　forming contacts by depositing a conductive material in a space between opposite gate spacers of adjacent ones of the gate stacks.

22. The method according to claim 21, wherein one of the adjacent gate stacks is a dummy gate stack.

* * * * *